(12) United States Patent
Lee (10) Patent No.: US 8,547,317 B2
(45) Date of Patent: Oct. 1, 2013

(54) PLL, DISPLAY USING THE SAME, AND METHOD FOR TIMING CONTROLLER TO GENERATE CLOCK USING THE SAME

(75) Inventor: Yong Jae Lee, Yongin-si (KR)

(73) Assignee: Anapass Inc., Seoul (KR)

( * ) Notice: Subject to any disclaimer, the term of this patent is extended or adjusted under 35 U.S.C. 154(b) by 139 days.

(21) Appl. No.: 13/110,523

(22) Filed: May 18, 2011

(65) Prior Publication Data

US 2011/0292011 A1  Dec. 1, 2011

(30) Foreign Application Priority Data

May 31, 2010 (KR) .................. 10-2010-0050935

(51) Int. Cl.
*G09G 3/36* (2006.01)
(52) U.S. Cl.
USPC ............................................ 345/99; 345/204
(58) Field of Classification Search
None
See application file for complete search history.

(56) References Cited

U.S. PATENT DOCUMENTS

| 8,140,882 B2* | 3/2012 | Lee et al. ........... 713/400 |
| 2005/0110589 A1* | 5/2005 | Loke et al. ......... 331/177 V |
| 2010/0007648 A1* | 1/2010 | Nam et al. ............ 345/213 |

FOREIGN PATENT DOCUMENTS

| KR | 10-2006-0117715 | 11/2006 |
| KR | 10-2009-0075044 | 7/2009 |
| KR | 10-2009-0096999 | 9/2009 |
| KR | 10-2010-0038825 | 4/2010 |

* cited by examiner

*Primary Examiner* — Joseph Haley
(74) *Attorney, Agent, or Firm* — Oliff & Berridge, PLC (57) ABSTRACT

Provided are a phase-locked loop (PLL) receiving an input clock and generating a clock, a display using the PLL, and a method for a timing controller to generate a clock using the PLL. The display includes a timing controller configured to generate a first clock using a PLL, insert the first clock into data, and transmit the data into which the first clock is inserted, transmission lines configured to transfer the data into which the first clock is inserted, and data-driver integrated circuits (ICs) configured to receive the data into which the first clock is inserted, separate the first clock from the data, and drive data lines of a liquid crystal panel on the basis of the first clock and the data. The PLL includes a phase detector configured to generate a DC error corresponding to a phase difference between an input clock and the first clock, a plurality of voltage-controlled oscillators (VCOs), a VCO selector configured to select a VCO having a frequency operating range, which is a range from the highest oscillation frequency of the VCO to the lowest oscillation frequency, including a frequency of the first clock from among the plurality of VCOs with reference to the DC error, and an inductor/capacitor (LC) resonant circuit connected with the selected VCO, including a plurality of fixed capacitors, and configured to perform coarse frequency tuning of the selected VCO.

10 Claims, 6 Drawing Sheets

PLL, DISPLAY USING THE SAME, AND METHOD FOR TIMING CONTROLLER TO GENERATE CLOCK USING THE SAME

TECHNICAL FIELD

The described technology relates generally to a timing controller and phase-locked loop (PLL) of a display and, more particularly, to a PLL receiving an input clock and generating a clock, a display using the PLL, and a method for a timing controller to generate a clock using the PLL.

BACKGROUND

In a display, an input/output signal has a wideband frequency. In particular, an intra-panel interface between a timing controller and data-driver integrated circuits (ICs) needs to support a variety of operating speeds according to the number of used driver ICs and the number of channels of the driver ICs. As a point-to-point high-speed interface having an operating speed of Gbps or more, such as a mini-low-voltage differential signaling (LVDS) interface, has been used lately, rather than a multi-drop interface, jitter characteristics of a signal of an intra-panel interface are gradually becoming important. To obtain low jitter, a used clock generation or recovery circuit should have low jitter, and also a voltage-controlled oscillator (VCO) and a PLL using the VCO should have a low-jitter characteristic. In the case of a ring oscillator, a delay of each delay cell is changed by changing a magnitude of current or voltage swing, and thereby a frequency of the ring oscillator is changed. A PLL using such a delay cell is inappropriate for a low-jitter PLL because the PLL has high sensitivity to supply voltage and its VCO has high noise.

An output frequency of an inductor/capacitor (LC) VCO is tuned by adjusting a value of a fixed capacitor or varactor, and a frequency tuning range is determined according to a ratio of a controllable capacitor to a parasitic capacitance. Here, to obtain a low jitter characteristic, a switch connected with a capacitor, etc. while supplying the LC VCO with a large amount of current should have low resistance. In this process, the parasitic capacitance increases, and the controllable capacitor to parasitic capacitance ratio may become 10 to 40 percent according to a common tuning range. Thus, to obtain an operating range having a highest-to-lowest required frequency ratio of 2 or more, that is, a controllable capacitor to parasitic capacitance ratio of 100 percent or more, two or more LC VCOs are necessary.

SUMMARY

Embodiments of the present disclosure provide a method and apparatus for a timing controller of a display to generate a clock using a phase-locked loop (PLL) including an inductor/capacitor (LC) voltage-controlled oscillator (VCO).

In one embodiment, a display is provided. The display includes: a timing controller configured to generate a first clock using a PLL, insert the first clock into data, and transmit the data into which the first clock is inserted; transmission lines configured to transfer the data into which the first clock is inserted; and data-driver integrated circuits (ICs) configured to receive the data into which the first clock is inserted, separate the first clock from the data, and drive data lines of a liquid crystal panel on the basis of the first clock and the data. Here, the PLL includes: a phase detector configured to generate a DC error corresponding to a phase difference between an input clock and the first clock; a plurality of VCOs; a VCO selector configured to select a VCO having a frequency operating range, which is a range from the highest oscillation frequency of the VCO to the lowest oscillation frequency, including a frequency of the first clock from among the plurality of VCOs with reference to the DC error; and an LC resonant circuit connected with the selected VCO, including a plurality of fixed capacitors, and configured to perform coarse frequency tuning of the selected VCO.

In another embodiment, a PLL receiving an input clock and generating a first clock is provided. The PLL includes: a plurality of VCOs; a VCO selector configured to select a VCO having a frequency operating range including a frequency of the first clock from among the plurality of VCOs; and an LC resonant circuit including a plurality of fixed capacitors and a varactor, connected with the selected VCO, and configured to perform coarse frequency tuning and fine frequency tuning of the selected VCO and generate the output clock. Here, the VCO selector connects a first VCO among the plurality of VCOs with the LC resonant circuit, and selects the first VCO as the VCO having the frequency operating range including the frequency of the first clock according to whether the frequency of the output clock is between the highest oscillation frequency and the lowest oscillation frequency of the first VCO.

In still another embodiment, a method for a timing controller to generate a clock using a PLL is provided. The method includes: selecting a VCO having a frequency operating range including a frequency of the clock from among a plurality of VCOs; and connecting the selected VCO with an LC resonant circuit including a varactor and a plurality of fixed capacitors, and performing coarse frequency tuning and fine frequency tuning to generate the clock. Here, selecting the VCO includes: connecting a first VCO among the plurality of VCOs with the LC resonant circuit; and selecting the first VCO when the frequency of the clock is between the highest oscillation frequency and the lowest oscillation frequency of the first VCO.

The Summary is provided to introduce a selection of concepts in a simplified form that are further described below in the Detailed Description. The Summary is not intended to identify key features or essential features of the claimed subject matter, nor is it intended to be used as an aid in determining the scope of the claimed subject matter.

BRIEF DESCRIPTION OF THE DRAWINGS

The above and other features and advantages of the present disclosure will become more apparent to those of ordinary skill in the art by describing in detail example embodiments thereof with reference to the attached drawings in which.

DETAILED DESCRIPTION

It will be readily understood that the components of the present disclosure, as generally described and illustrated in the Figures herein, could be arranged and designed in a wide variety of different configurations. Thus, the following more detailed description of the embodiments of apparatus and methods in accordance with the present disclosure, as represented in the Figures, is not intended to limit the scope of the disclosure, as claimed, but is merely representative of certain examples of embodiments in accordance with the disclosure. The presently described embodiments will be best understood by reference to the drawings, wherein like parts are designated by like numerals throughout.

Meanwhile, terms used herein are to be understood as follows.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," "on" versus "directly on," etc.).

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
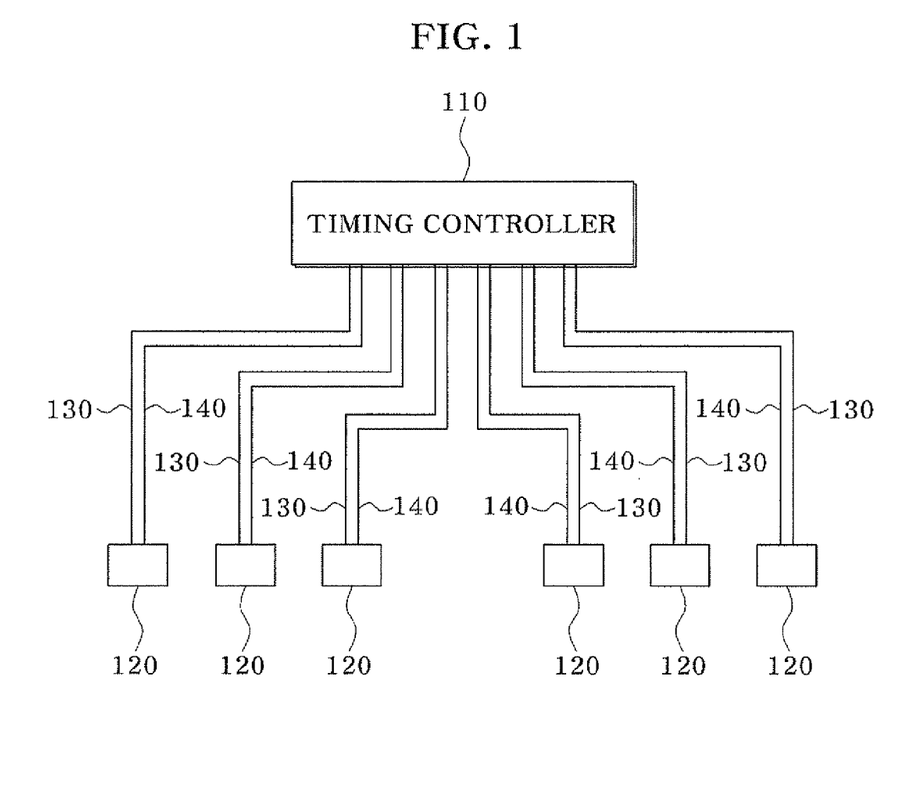
FIG. 1 illustrates an interface between a timing controller and respective data-driver integrated circuits (ICs) of a display according to an embodiment of the present disclosure.

FIG. 1 illustrates an interface between a timing controller and respective data-driver integrated circuits (ICs) of a display according to an embodiment of the present disclosure.

A timing controller 110 and respective data-driver ICs 120 are connected through transmission lines 130. The timing controller 110 inserts a first clock into data, and transmits the data into which the first clock is inserted to the respective data-driver ICs 120 through the respective transmission lines 130. Thus, the timing controller 110 does not require a connection line for transmitting a clock. The timing controller 110 may convert the data into which the first clock is inserted into a differential signal and serially transmit the differential signal. The timing controller 110 includes a phase-locked loop (PLL), which includes an inductor/capacitor (LC) resonant circuit and a plurality of voltage-controlled oscillators (VCOs). The timing controller 110 selects one VCO corresponding to a frequency of the first clock from among the plurality of VCOs and performs coarse tuning and fine tuning on the selected VCO, thereby locking the PLL.

The respective data-driver ICs 120 separately receive the differential signal through the respective transmission lines 130, recover the data into which the first clock is inserted from the differential signal, and separate the first clock from the data. Each of the data-driver ICs 120 generates a second clock having a frequency which is a multiple of the frequency of the first clock, samples and then latches the data using the second clock, and drives a data line of a liquid crystal panel according to the latched data.

Figure 2:
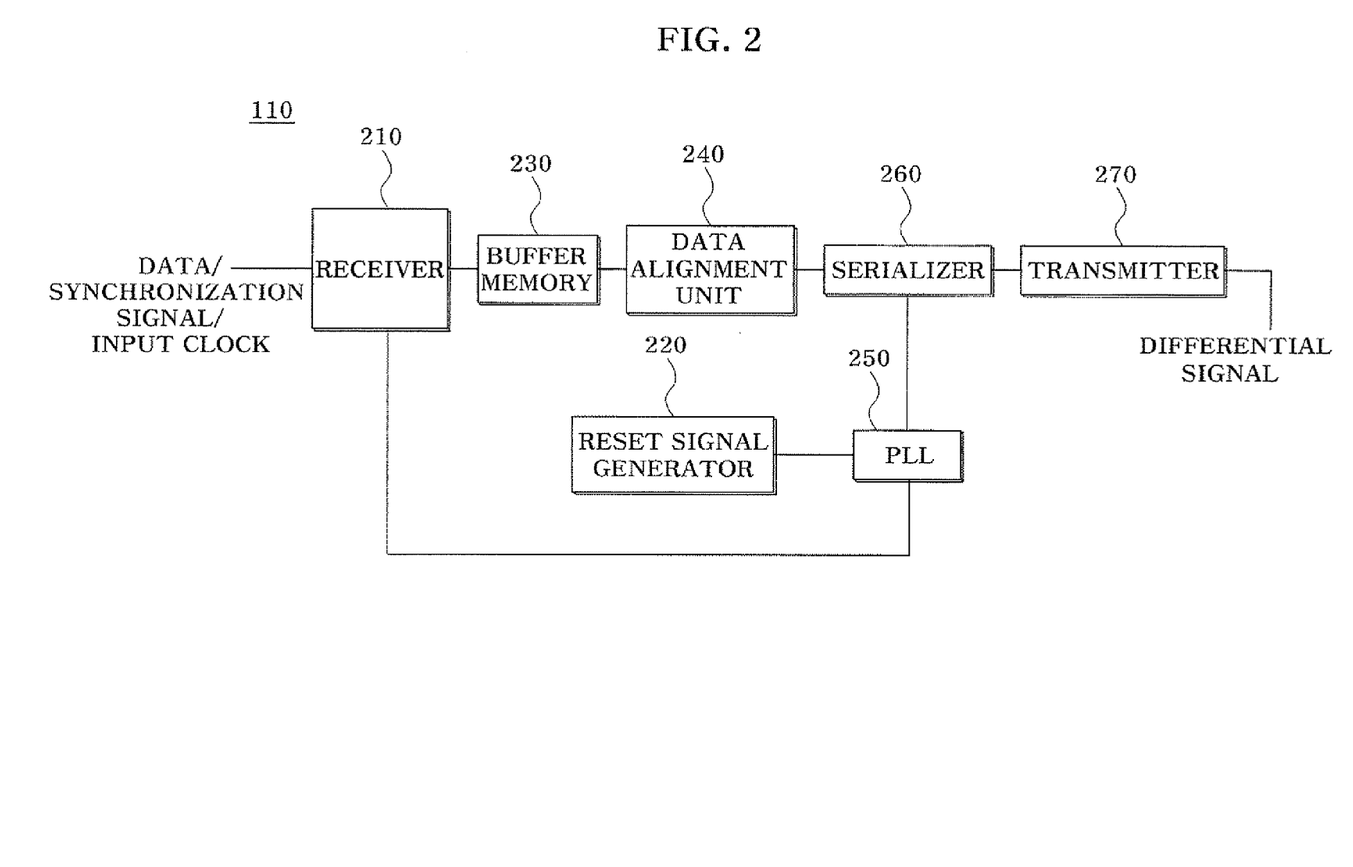
FIG. 2 is a block diagram of the timing controller shown in FIG. 1.

FIG. 2 is a block diagram of the timing controller shown in FIG. 1. Referring to FIG. 2, the timing controller 110 includes a receiver 210, a reset signal generator 220, a buffer memory 230, a data alignment unit 240, a PLL 250, a serializer 260, and a transmitter 270.

The receiver 210 receives low-voltage differential signaling (LVDS) data. Here, the LVDS data includes 8-bit red, green and blue (RGB) data, an 8-bit synchronization signal, and an 8-bit input clock CLK_in.

The reset signal generator 220 generates and transmits a reset signal RS to the PLL 250 when initial power is supplied from the outside, or a frequency of the input clock CLK_in varies. Here, the reset signal RS enables one of a plurality of VCOs included in the PLL 250 to be selected, and coarse tuning and fine tuning of the selected VCO to be started.

The buffer memory 230 receives the RGB data from the receiver 210, temporarily stores the RGB data, and then outputs the RGB data to the data alignment unit 240.

The data alignment unit 240 receives the RGB data from the buffer memory 230, separates the RGB data according to the respective data-driver ICs 120, and provides the separated RGB data to the serializer 260 so that the transmitter 270 can transmit the RGB data to the respective data-driver ICs 120 on a point-to-point basis. During initialization, the data alignment unit 240 does not provide RGB data but provides a clock-shaped pattern to the serializer 260.

The PLL 250 includes the plurality of VCOs and an LC resonant circuit, and generates a first clock by dividing the frequency of the input clock CLK_in. When the reset signal RS is received from the reset signal generator 220, the PLL 250 selects a VCO corresponding to a frequency of the first clock from among the plurality of VCOs, and performs coarse tuning and fine tuning on the selected VCO and the LC resonant circuit, thereby generating the first clock synchronized with a phase of the input clock CLK_in and having a frequency which is a multiple of the frequency of the input clock CLK_in.

The serializer 260 receives the RGB data separated according to the respective data-driver ICs 120 from the data alignment unit 240, and serializes the RGB data. The serializer 260 receives the first clock from the PLL 250, and inserts the first clock into the serialized RGB data, thereby generating transmission data.

The transmitter 270 converts the transmission data into a differential signal and transmits the differential signal to the respective data-driver ICs 120 through the respective transmission lines 130.

Figure 3:
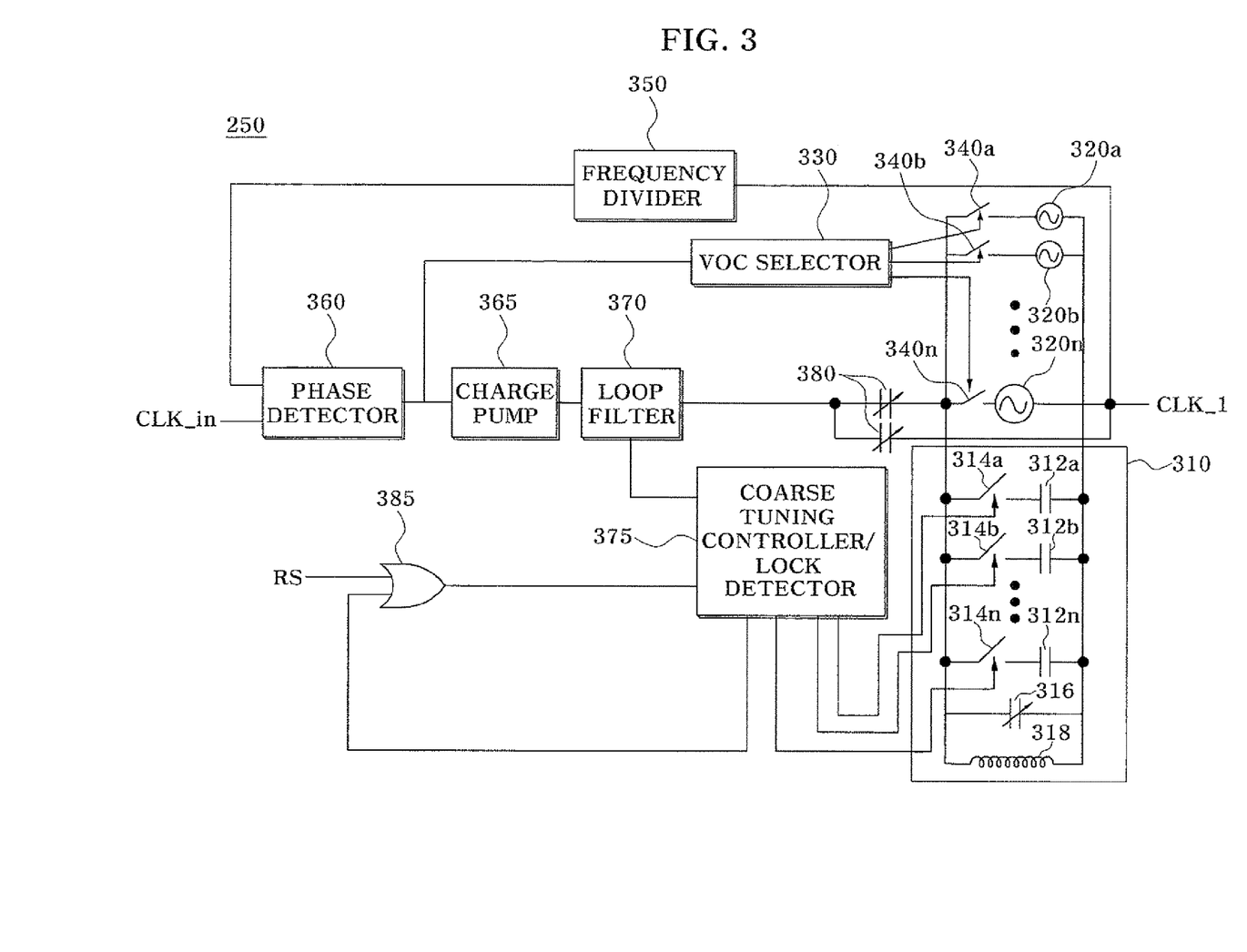
FIG. 3 illustrates a phase-locked loop (PLL) shown in FIG. 2.

FIG. 3 illustrates a PLL shown in FIG. 2. Referring to FIG. 3, the PLL 250 includes an LC resonant circuit 310, a plurality of VCOs 320, a VCO selector 330, a switch 340, a frequency divider 350, a phase detector 360, a charge pump 365, a loop filter 370, a coarse tuning controller/lock detector 375, a varactor 380, and an OR operation unit 385.

The VCOs 320 are connected in parallel with the LC resonant circuit 310 through the switch 340. Here, the VCOs 320 have different specific frequency bands.

The VCO selector 330 selects one VCO 320n having a frequency operating range including a frequency of a first clock from among the VCOs 320, and controls the switch 340 to connect the selected VCO 320n with the LC resonant circuit 310. To this end, the VCO selector 330 sequentially connects the plurality of VCOs 320 with the LC resonant circuit 310 one by one and determines whether a frequency operating range of a connected VCO 320n includes the frequency of the first clock until finding a VCO having a frequency operating range including the frequency of the first clock.

For example, the VCO selector 330 controls the switch 340 to connect a first VCO 320a having the lowest frequency operating range with the LC resonant circuit 310. When a DC error output from the phase detector 360 is up while all fixed capacitors 312 are connected with the first VCO 320a, the VCO selector 330 may determine that the frequency of the first clock is higher than the lowest oscillation frequency of the first VCO 320a. On the other hand, when the DC error output from the phase detector 360 is down, the VCO selector 330 may determine that the frequency of the first clock is lower than the lowest oscillation frequency of the first VCO 320a. Also, when the DC error output from the phase detector 360 is up while the fixed capacitors 312 are not connected with the first VCO 320a, the VCO selector 330 may determine that the frequency of the first clock is higher than the highest oscillation frequency of the first VCO 320a. On the other hand, when the DC error output from the phase detector 360 is down, the VCO selector 330 may determine that the frequency of the first clock is lower than the highest oscillation frequency of the first VCO 320a. When the DC error output from the phase detector 360 is up while the fixed capacitors 312 are connected with the first VCO 320a, and the DC error output from the phase detector 360 is down while the fixed capacitors 312 are not connected with the first VCO 320a, the frequency of the first clock is included in a frequency operating range from the highest frequency of the first VCO 320a to the lowest frequency. Thus, the VCO selector 330 selects and connects the first VCO 320a with the LC resonant circuit 310. When both of the DC error output from the phase detector 360 while the fixed capacitors 312 are connected with the first VCO 320a and the DC error output from the phase detector 360 while the fixed capacitors 312 are not connected with the first VCO 320a are up, the VCO selector 330 connects a second VCO 320b having a one-level higher frequency operating range than the first VCO 320a with the LC resonant circuit 310, and determines whether the frequency of the first clock is included in a frequency operating range of the second VCO 320b.

The LC resonant circuit 310 includes the plurality of fixed capacitors 312, switches 314, and an inductor 318, and is connected in parallel with the selected VCO 320n. The LC resonant circuit 310 has a resonant frequency determined by the plurality of fixed capacitors 312 and the inductor 318. The VCO 320n connected in parallel with the LC resonant circuit 310 generates a signal having a frequency corresponding to the resonant frequency of the LC resonant circuit 310. Here, coarse frequency tuning of the VCO 320n is performed by switching at least one of the plurality of capacitors 312. The resonant frequency of the LC resonant circuit 310 varies according to the switching operation, and a frequency of a signal output from the VCO 320n also varies according to the varied resonant frequency. Also, fine frequency tuning of the VCO 320n is performed by adjusting voltage applied to the varactor 380. The varactor 380 has a variable capacitance which varies according to the applied voltage.

The first clock output from the VCO 320n is fed back to the phase detector 360 via the frequency divider 350. The frequency divider 350 divides the frequency of the signal output from the VCO 320n according to a predetermined ratio to generate a divided first clock CLK_div, and transmits the divided first clock CLK_div to the phase detector 360. The phase detector 360 receives the divided first clock CLK_div and the input clock CLK_in, compares a phase of the divided first clock CLK_div with the phase of the input clock CLK_in, and generates a DC error corresponding to the phase difference. Here, the DC error may be up when the phase of the input clock CLK leads the divided first clock CLK_div, and down when the phase of the input clock CLK lags the divided first clock CLK_div. The charge pump 365 receives the DC error and outputs current corresponding to the DC error.

The loop filter 370 receives the current from the charge pump 365 and generates control voltage according to the received current. The control voltage can adjust the frequency of the output signal of the VCO 320n through a coarse tuning mechanism and fine tuning mechanism. To be specific, the coarse tuning controller/lock detector 375 begins operation when a tuning start signal is received from the OR operation unit 385, and may add or remove at least one of the fixed capacitors 312 to or from the LC resonant circuit 310 by controlling the switches 314 on the basis of the control voltage received from the loop filter 370. Also, the control voltage output from the loop filter 370 may adjust voltage applied to the varactor 380. Through the two tuning mechanisms, the oscillation frequency of the VCO 320n may be adjusted. Here, a tuning range of the oscillation frequency in accordance with the varactor 380 may be slightly larger than a tuning range in accordance with one fixed capacitor.

The OR operation unit 385 performs an OR operation on the reset signal RS and an internal unlock signal, thereby generating the tuning start signal instructing to start coarse frequency tuning. The OR operation unit 385 may generate the tuning start signal if the reset signal RS generated when initial power is supplied from the outside or the frequency of the input clock CLK_in varies or the internal unlock signal resulting from an abnormal internal operation of the PLL 250 is input.

When the tuning start signal is received from the OR operation unit 385, the coarse tuning controller/lock detector 375 compares the frequency of the input clock CLK_in with a frequency of the divided first clock CLK_div and adjusts a capacitance of the LC resonant circuit 310 according to the comparison result. As an example, the coarse tuning controller/lock detector 375 may compare the frequency of the input clock CLK_in with the frequency of the divided first clock CLK_div on the basis of the control voltage input from the loop filter 370. As another example, the coarse tuning controller/lock detector 375 may receive the input clock CLK_in and the divided first clock CLK_div and directly compare their frequencies with each other. The coarse tuning controller/lock detector 375 may perform coarse tuning by turning on or off the switches 314 connected with the capacitors 312. For example, when the frequency of the divided first clock CLK_div is lower than the frequency of the input clock CLK_in, the coarse tuning controller/lock detector 375 may increase the frequency of the first clock, which is the output of the VCO 320n, by reducing the capacitance. The coarse tuning controller/lock detector 375 detects unlock of the PLL 250, thereby generating the internal unlock signal.

Figure 4:
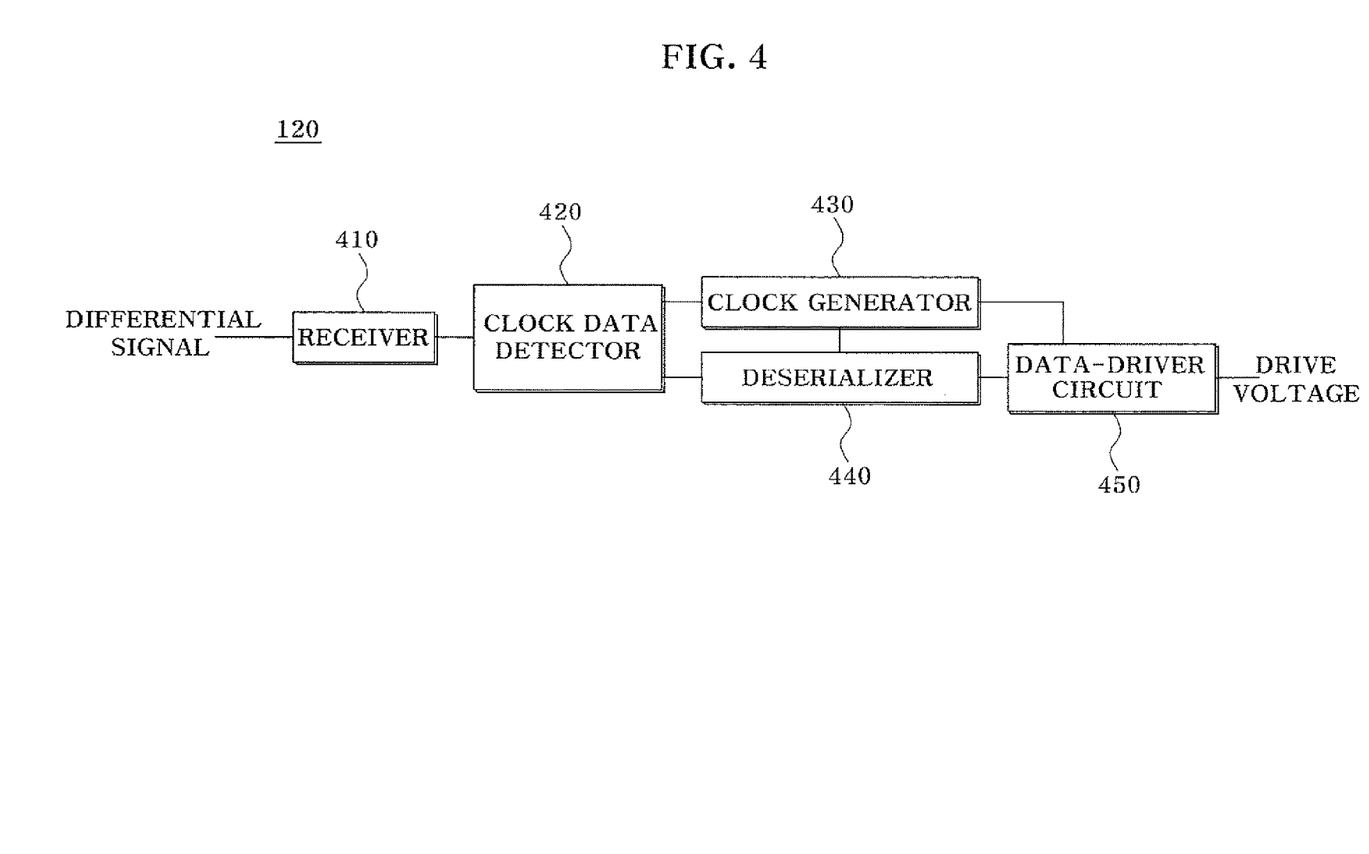
FIG. 4 is a block diagram of a data-driver IC shown in FIG. 1.

FIG. 4 is a block diagram of a data-driver IC shown in FIG. 1. Referring to FIG. 4, the data-driver IC 120 includes a receiver 410, a clock data detector 420, a clock generator 430, a deserializer 440, and a data-driver circuit 450.

The receiver 410 receives an LVDS differential signal through the transmission line 130, and recovers transmission data from the differential signal.

The clock data detector 420 detects a first clock and serial data from the transmission data.

The clock generator 430 receives the first clock and generates a second clock synchronized with the first clock and having a frequency which is a multiple of the frequency of the first clock. For example, the clock generator 430 may include a delay-locked loop (DLL) or PLL. When the clock generator 430 is a PLL, the PLL may include the same constitution as the PLL shown in FIG. 3.

The deserializer 440 converts the serial data into parallel data using the second clock.

The data-driver circuit 450 samples and latches the parallel data according to the second clock and then performs digital-to-analog conversion on the parallel data, thereby generating a drive voltage. The data-driver circuit 450 applies the drive voltage to respective signal lines of a liquid crystal panel.

Figure 5:
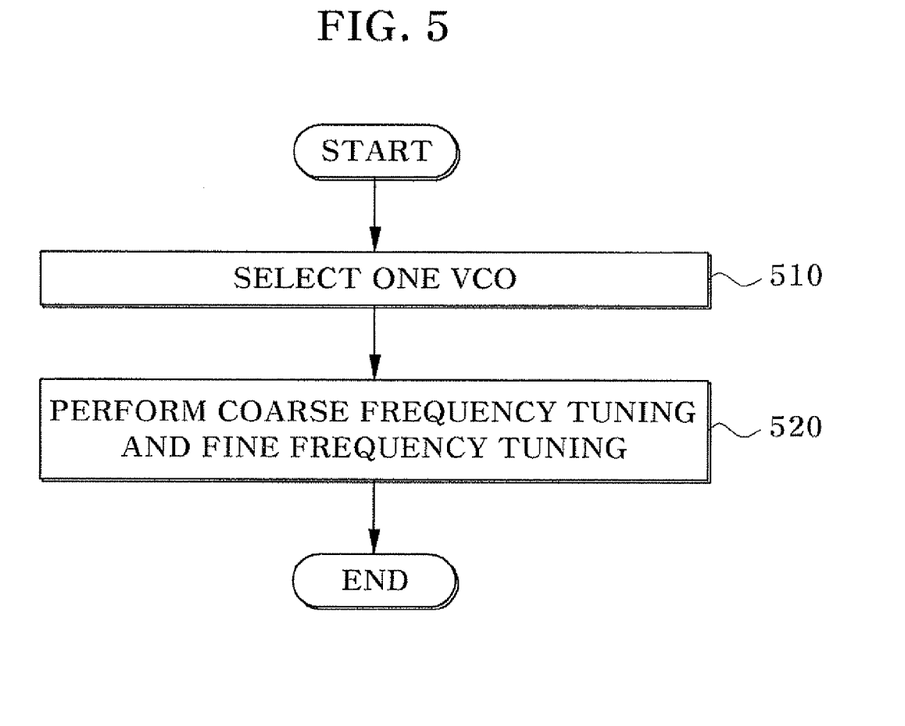
FIG. 5 is a flowchart illustrating a method for a PLL of a timing controller to generate a clock according to an embodiment of the present disclosure.

FIG. 5 is a flowchart illustrating a method for a PLL of a timing controller to generate a clock according to an embodiment of the present disclosure. Since a case in which the PLL 250 of FIGS. 2 and 3 is implemented in time series also corresponds to this embodiment, the description of the PLL 250 is applied to this embodiment as it is.

Referring to FIG. 5, in step 510, a PLL 250 selects a VCO 320n having a frequency operating range including a frequency of a first clock from among a plurality of VCOs 320.

In step 520, the PLL 250 connects the selected VCO 320n with an LC resonant circuit 310 and performs coarse frequency tuning and fine frequency tuning. Here, the coarse frequency tuning may be performed by adding or removing at least one of a plurality of fixed capacitors 312 included in the LC resonant circuit 310 to or from the LC resonant circuit 310 using the switches 314. Also, the fine frequency tuning may be performed by adjusting voltage applied to a varactor 380. The selected VCO 320n may generate the first clock through the coarse frequency tuning and the fine frequency tuning.

Figure 6:
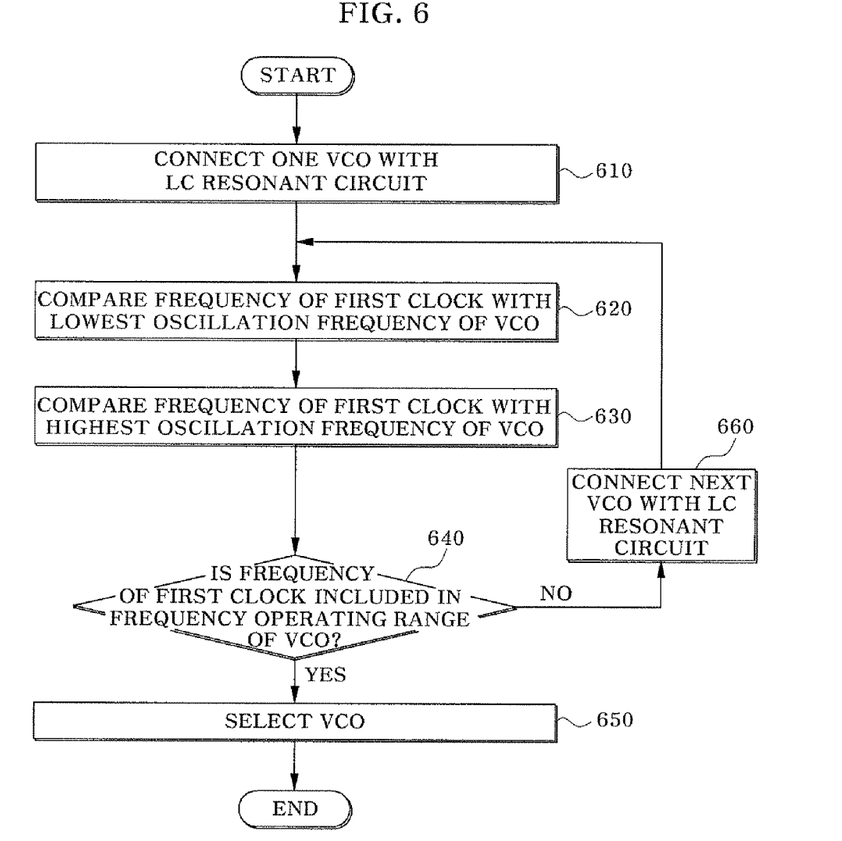
FIG. 6 is a flowchart illustrating step 510 of FIG. 5.

FIG. 6 is a flowchart illustrating step 510 of FIG. 5.

In step 610, the PLL 250 controls a switch 340 to connect one VCO 320n among the plurality of VCOs 320 with the LC resonant circuit 310. Here, the VCOs 320 have different specific frequency bands. Also, the VCO 320n initially connected with the LC resonant circuit 310 may be a VCO 320a having the lowest frequency operating range among the plurality of VCOs 320.

In step 620, the PLL 250 compares the lowest oscillation frequency of the VCO 320n connected with the LC resonant circuit 310 with the frequency of the first clock. Here, the lowest oscillation frequency may be an oscillation frequency of the VCO 320n while all the fixed capacitors 312 included in the LC resonant circuit 310 are connected with the VCO 320n. The PLL 250 may compare the lowest oscillation frequency of the VCO 320n with the frequency of the first clock with reference to a DC error output from a phase detector 360. When the DC error is up, the lowest oscillation frequency of the VCO 320n is lower than the frequency of the first clock, and when the DC error is down, the lowest oscillation frequency of the VCO 320n is higher than the frequency of the first clock.

In step 630, the PLL 250 compares the highest oscillation frequency of the VCO 320n connected with the LC resonant circuit 310 with the frequency of the first clock. Here, the highest oscillation frequency may be an oscillation frequency of the VCO 320n while none of the fixed capacitors 312 included in the LC resonant circuit 310 are connected with the VCO 320n. The PLL 250 may compare the highest oscillation frequency of the VCO 320n with the frequency of the first clock with reference to a DC error output from the phase detector 360. When the DC error is up, the highest oscillation frequency of the VCO 320n is lower than the frequency of the first clock, and when the DC error is down, the highest oscillation frequency of the VCO 320n is higher than the frequency of the first clock.

In step 640, the PLL 250 determines whether the frequency of the first clock is included in a range from the lowest oscillation frequency of the VCO 320n connected with the LC resonant circuit 310 to the highest oscillation frequency.

In step 650, when the frequency of the first clock is included in the range from the lowest oscillation frequency of the VCO 320n connected with the LC resonant circuit 310 to the highest oscillation frequency, the PLL 250 selects the VCO 320n.

In step 660, when the frequency of the first clock is not included in the range from the lowest oscillation frequency of the VCO 320n to the highest oscillation frequency, the PLL 250 controls the switch 340 to cut off the connection between the VCO 320n and the LC resonant circuit 310 and connect a VCO having a one-level higher frequency operating range than the VCO 320n with the LC resonant circuit 310, and the process proceeds to step 620.

The present disclosure may have the following effects. However, this does not mean that a specific embodiment should have all or only the following effects. Thus, the scope of the present disclosure should not be understood as being limited to these effects.

A timing controller according to an embodiment includes an LC VCO having a good phase noise or jitter characteristic, so that a high-speed interface between the timing controller and data-driver ICs can be implemented.

A PLL according to an embodiment selects one of a plurality of LC VCOs having different frequency bands to generate a clock, and thus can support a wide frequency band range.

The foregoing is illustrative of the present disclosure and is not to be construed as limiting thereof. Although numerous embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:
1. A display, comprising:
 a timing controller configured to generate a first clock using a phase-locked loop (PLL), insert the first clock into data, and transmit the data into which the first clock is inserted;

transmission lines configured to transfer the data into which the first clock is inserted; and data-driver integrated circuits (ICs) configured to receive the data into which the first clock is inserted, separate the first clock from the data, and drive data lines of a liquid crystal panel on the basis of the first clock and the data, wherein the PLL includes:

a phase detector configured to generate a DC error corresponding to a phase difference between an input clock and the first clock;

a plurality of voltage-controlled oscillators (VCOs);

a VCO selector configured to select a VCO having a frequency operating range, which is a range from a highest oscillation frequency of the VCO to a lowest oscillation frequency of the VCO, including a frequency of the first clock from among the plurality of VCOs with reference to the DC error; and an inductor/capacitor (LC) resonant circuit connected with the selected VCO, including a plurality of fixed capacitors, and configured to perform coarse frequency tuning of the selected VCO.

2. The display according to claim 1, wherein the VCO selector sequentially connects the plurality of VCOs with the LC resonant circuit beginning with a VCO having a lowest frequency operating range, and determines whether a frequency operating range of each VCO connected with the LC resonant circuit includes the frequency of the first clock.

3. The display according to claim 2, wherein the highest oscillation frequency is an oscillation frequency of the VCO while the VCO is not connected with the fixed capacitors, and the lowest oscillation frequency is an oscillation frequency of the VCO while the VCO is connected with the fixed capacitors.

4. The display according to claim 3, wherein the VCO selector selects the VCO connected with the LC resonant circuit when the DC error is up while the VCO connected with the LC resonant circuit is connected with the fixed capacitors, and down while the VCO connected with the LC resonant circuit is not connected with the fixed capacitors.

5. The display according to claim 2, wherein the LC resonant circuit performs coarse frequency tuning by changing connection between the selected VCO and the plurality of fixed capacitors, and thereby generates the first clock.

6. A phase-locked loop (PLL) receiving an input clock and generating a first clock, comprising:

a plurality of voltage-controlled oscillators (VCOs);

a VCO selector configured to select a VCO having a frequency operating range including a frequency of the first clock from among the plurality of VCOs; and an inductor/capacitor (LC) resonant circuit including a plurality of fixed capacitors, connected with the selected VCO, and configured to perform coarse frequency tuning of the selected VCO and generate the first clock, wherein the VCO selector connects a first VCO among the plurality of VCOs with the LC resonant circuit, and selects the first VCO as the VCO having the frequency operating range including the frequency of the first clock according to whether the frequency of the first clock is between a highest oscillation frequency and a lowest oscillation frequency of the first VCO.

7. The PLL according to claim 6, wherein the highest oscillation frequency of the first VCO is an oscillation frequency of the first VCO while the fixed capacitors are not connected with the first VCO, and the lowest oscillation frequency of the first VCO is an oscillation frequency of the first VCO while the fixed capacitors are connected with the first VCO.

8. The PLL according to claim 7, further comprising a phase detector configured to generate a DC error corresponding to a phase difference between the input clock and the first clock, wherein the VCO selector compares the frequency of the first clock with the highest and lowest oscillation frequencies of the first VCO with reference to the DC error.

9. A method for a timing controller to generate a clock using a phase-locked loop (PLL), the method comprising:

selecting a voltage-controlled oscillator (VCO) having a frequency operating range including a frequency of the clock from among a plurality of VCOs; and connecting the selected VCO with an inductor/capacitor (LC) resonant circuit including a plurality of fixed capacitors, and performing coarse frequency tuning and fine frequency tuning to generate the clock, wherein selecting the VCO includes:

connecting a first VCO among the plurality of VCOs with the LC resonant circuit; and selecting the first VCO when the frequency of the clock is between a highest oscillation frequency and a lowest oscillation frequency of the first VCO.

10. The method according to claim 9, wherein the highest oscillation frequency of the first VCO is an oscillation frequency of the first VCO while the fixed capacitors are not connected with the first VCO, and the lowest oscillation frequency of the first VCO is an oscillation frequency of the first VCO while the fixed capacitors are connected with the first VCO.

* * * * *